(12) United States Patent
Parkes et al.

(10) Patent No.: US 6,297,419 B1
(45) Date of Patent: Oct. 2, 2001

(54) METHOD OF WASTE TREATMENT

(75) Inventors: Peter Parkes; Jeffrey William Hobbs; Simon Lawson, all of Cumbria (GB)

(73) Assignee: British Nuclear Fuels PLC, Warrington (GB)

( * ) Notice: Subject to any disclaimer, the term of this patent is extended or adjusted under 35 U.S.C. 154(b) by 0 days.

(21) Appl. No.: 09/087,059

(22) Filed: May 29, 1998

(51) Int. Cl.$^7$ ........................................................ G21F 9/00
(52) U.S. Cl. ................................................ 588/10; 588/18
(58) Field of Search ........................ 264/0.5, 621, 622, 264/623, 28; 588/10, 18, 1, 2, 11; 501/12; 65/17.2; 976/DIG. 375; 423/80, 73, 85

(56) References Cited

U.S. PATENT DOCUMENTS

| | | | |
|---|---|---|---|
| 2,467,089 | * | 4/1949 | Marisic et al. .......................... 23/140 |
| 2,603,570 | * | 7/1952 | Bole ........................................ 106/84 |
| 4,025,350 | * | 5/1977 | Walters et al. ...................... 106/38.35 |
| 4,430,257 | * | 2/1984 | Pope et al. ............................. 252/629 |
| 4,487,711 | * | 12/1984 | Pope et al. ............................. 252/629 |
| 4,569,920 | * | 2/1986 | Smith-Johannsen ....................... 501/1 |
| 5,006,248 | * | 4/1991 | Anderson et al. .............. 210/500.25 |
| 5,091,348 | * | 2/1992 | Woodhead et al. ................... 501/136 |
| 5,114,887 | * | 5/1992 | Sekine et al. ........................... 501/95 |
| 5,213,591 | * | 5/1993 | Celikkaya et al. ...................... 51/293 |
| 5,294,573 | * | 3/1994 | Haun ...................................... 501/12 |
| 5,326,518 | * | 7/1994 | Kimura et al. .......................... 264/63 |
| 5,494,863 | * | 2/1996 | Mathur .................................. 501/12 |

FOREIGN PATENT DOCUMENTS

| | | | |
|---|---|---|---|
| 8340938 | * | 7/1998 | (JP) ....................................... 264/0.5 |

OTHER PUBLICATIONS

Atkinson et al., The Fabrication and Properties of Zr–O–F Ceramics for the Immobilization of Zircaloy Nuclear Waste, Journal of Materials Science, p2979–2989, Oct. 1982.*

Wood et al., Sol–Gel Science and Technology, p3–23, Oct. 1994.*

* cited by examiner

*Primary Examiner*—Steven P. Griffin
*Assistant Examiner*—Eileen E. Nave
(74) *Attorney, Agent, or Firm*—Bracewell & Patterson, L.L.P.

(57) ABSTRACT

This disclosure sets forth a method for processing metal waste incorporating substantial zirconium as exemplified by nuclear fuel rods which include enriched uranium and other nuclear products. This process contemplates conversion of the zirconium and other constituents into oxides by mixing with an acid, subsequently forming a solution or a gel which is either dried or frozen, thereby yielding a green shaped body. The green body is thereafter sintered to form a dimensionally and structurally stable monolith for disposal.

34 Claims, 2 Drawing Sheets

METHOD OF WASTE TREATMENT

BACKGROUND

Figure 1:
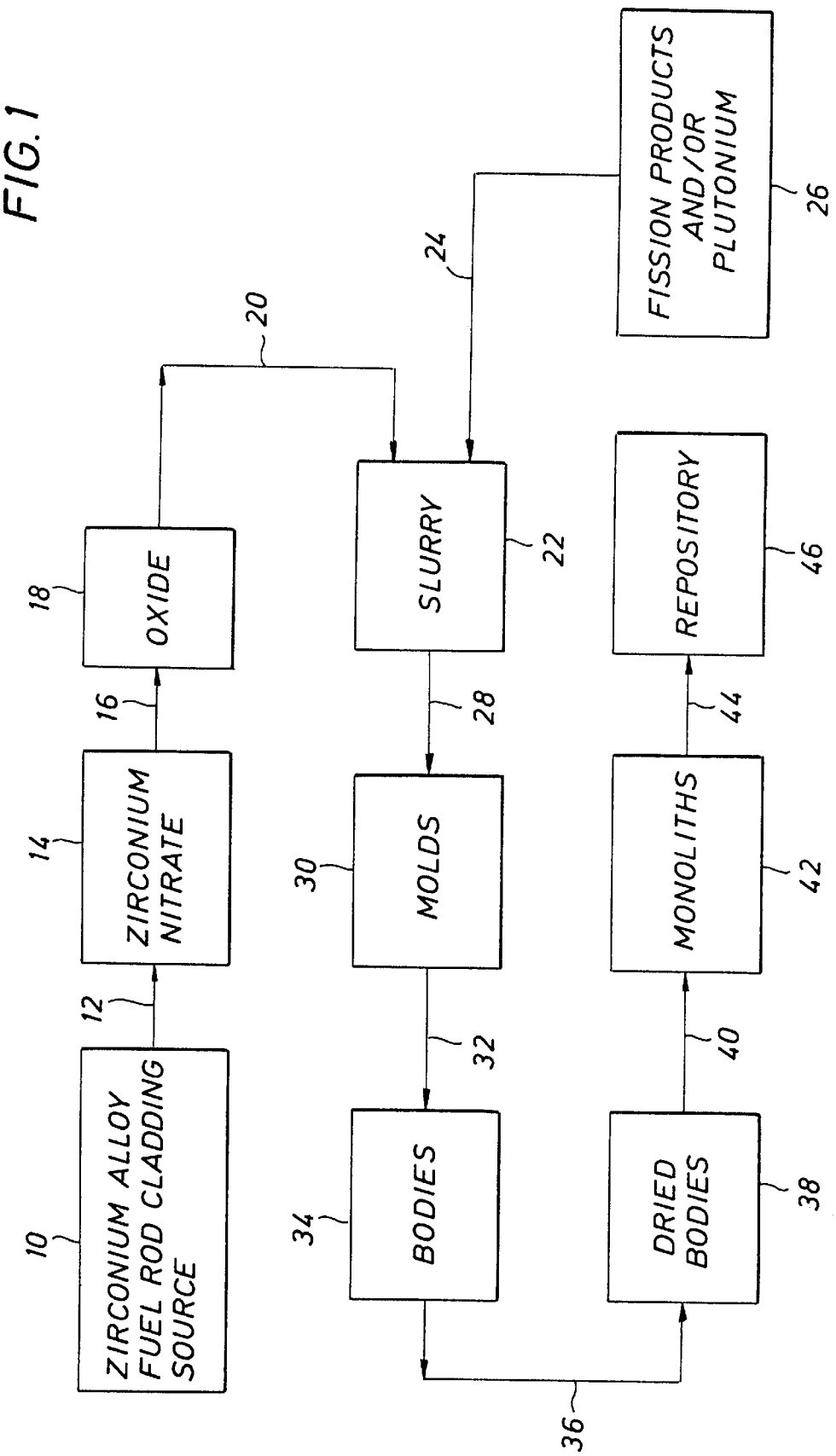

The present invention relates to a method of treating zirconium based metal waste particularly, though not exclusively, waste resulting from nuclear fuel reprocessing.

Fuel rods for nuclear plants comprise a core of enriched uranium material having an outer can or cladding of a zirconium based alloy. Presently, when the spent fuel rods are reprocessed, they are chopped up into shorter lengths and treated with nitric acid to dissolve out the spent fuel core, leaving behind the cladding since it is not attacked by the nitric acid. The pieces of zirconium alloy constitute so-called intermediate level waste which needs to be contained and stored safely for many years. One current method of dealing with this waste is to crush the pieces and store it encapsulated as the metal in concrete grout in drums.

A further problem with reprocessing irradiated fuel is that associated with isolating and dealing with the fission products generated during the nuclear reaction process. Normally, the fission products are separated from the uranium and plutonium, the latter two elements being reprocessed for further use. However, it is necessary to contain and safely store the fission by-products as they constitute so-called high-level waste. One method of dealing with this waste is by encapsulation by vitrification. Dealing with the zirconium waste and the fission product waste currently constitutes two separate stages of the reprocessing cycle and are both extremely costly in both plant and in running costs.

It is an object of the present invention to provide a process for dealing more economically with zirconium waste. It is a further object to provide an alternative and more cost effective means of dealing with and storing the fission product waste.

The present invention relates to a process for treating zirconuim based metal waste, the process including the steps of converting at least some of said zirconium based metal into an oxide (as herein defined). As hereafter described in more detail, the oxide is used in the production of a green body, for example by pressing, and the green body is sintered.

According to a first aspect of the present invention there is provided a process for treating zirconium based metal waste, said waste comprising at least some of the zirconium based metal in solution, the process including the steps of converting at least said solution of said metal into an oxide of said zirconium based metal; and, sintering said oxide to form solid articles.

One zirconium based mental alloy currently is use is known as "Zircalloy" (trade name) and comprises in excess of 95 wt % zirconium.

The step of bringing the zirconium based metal into solution by chemical or electrochemical means is known in the prior art and provides a stable solution, e.g., a nitrate and oxide residues. See, for example, "Use of Electrochemical Processes in Aqueous Reprocessing of Nuclear Fuels" by F. Baumgarter and H. Schmeider, Radiochemical Acta, Vol. 25 pp 191–210 (1978).

In this specification the terms "zirconium oxide" and "oxide of zirconium" and similar terms are frequently used. The actual chemical compositions resulting from the processes described herein may not have chemical compositions which correspond exactly either to a pure zirconium oxide or to zirconia, $ZrO_2$, since the sintered materials in question will contain impurities and/or intentionally added materials and contaminants which it is desired to encapsulate, and/or to stabilize the crystal phase and which may also modify the crystal structure. Examples of such stabilizing and modifying additions may include, for example, metal oxides such as yttria, $Y_2O_3$ to stabilize the crystal phase of zirconium oxide. Furthermore, in embodiments to be described below, particles of zirconium oxide powder are embodied in a matrix also containing aluminum and/or silicon atoms. Therefore, any reference herein to "zirconium oxide" or similar terms are to be taken as generic terms encompassing the resulting matrix of the sintered product or intermediate material in all embodiments and variations of the invention described herein howsoever arrived at.

The zirconium based metal may constitute waste resulting from irradiated fuel rods from nuclear plants for example.

The zirconium based metal may be brought into solution by electrochemical dissolution wherein the metal is made anodic in a electrolyte or nitric acid so converting the metal to a nitrate. In this method, a substantial proportion, perhaps about 85% of the zirconium metal, is converted directly to the oxide which forms a sludge in the dissolution vessel. The remaining nitrate may be thermally treated to decompose the nitrate to the oxide in a known manner.

The resulting oxide may be separated, dried and milled to break down friable flakes if necessary; the resulting powder being pressed, cast or extruded for example into "green" compacts and sintered to solid bodies in known manner at temperatures up to about 1800° C.

Those steps in the ceramics art normally associated with the pressing and sintering of refractory oxide materials may be employed as desired and include such steps as appropriate as mixing with resin binders and/or lubricating waxes and preliminary burn-off treatments to remove such resins and waxes for example prior to sintering. Such steps are described in standard texts such as "Enlargement and Compaction of Particulate Solids", Ed. Nayland G. Stanley-Wood, Butterworths & Co. Ltd. 1983, particularly chapters 7 and 11; "Principles of Powder Technology", Ed. Martin Rhodes, Wiley, 1994, chapter 10; and "Principles of Ceramic Processing", J S Reed, Wiley Inter-science 1995, chapters 12, 17, 20, 22, and 29.

In practicing the present invention, where the zirconium based metal constitutes the cladding of a nuclear fuel rod, the whole fuel rod, including the irradiated uranium fuel, is preferable brought into solution in nitric acid. Thus, the solution will contain nitrates of uranium, plutonium, zirconium and also the fission products in the spent fuel. The uranium and plutonium may then be separated from the solution by one of the known so called "PUREX" processes which are essentially solvent extraction techniques. See for example, "The Chemistry of the Purex Process" by J. Malvyn McKibben, Radiochinica Acta 36 (1984) 3–15. This results in the solution retaining the fission by-products which are normally treated as a separate waste product. Again, the resulting nitrates may be thermally treated to decompose and convert them to oxide, including those of at least some of the fission products.

The zirconium based metal may alternatively be brought into solution by a route other than one of the so-called "PUREX" processes. For example, the zirconium metal waste may by converted to ZrX, where "X" is a halide, using an intensified fluorination technique such as by a fluidised bed with hydrogen fluoride. Other fluorinating agents such as nitrofluor (NOF:3HF) may also be used. The zirconium halides thus prepared may be readily converted to oxides.

Alternatively, oxides of the fission products may be separately treated and subsequently blended with the zirconium oxide powder in a preferred proportion.

A major advantage of the latter option is that the fission products are effectively encapsulated in the resulting sintered zirconium oxide body and a separate treatment stage for the fission products is removed from the process with a consequently great cost saving. Zirconium oxide is a particularly stable ceramic and has the necessary chemical durability to allow it to form the matrix for encapsulation of the high-level waste fission products. Furthermore, the melting point of zirconium oxide is greatly in excess of glass which forms the matrix in current verification encapsulation processes. The sintered bodies may be stored in drums in concrete grout for example. A further advantage conferred by the nature of zirconium oxide compared with glass is that it may allow higher levels of fission product waste to be incorporated into the ceramic encapsulate than is achievable with glass.

The sintered zirconium oxide material may also by used to encapsulate some or all of the plutonium arising from the nuclear reaction process in the same manner as described with reference to the fission products above.

The irradiated fuel rods may be processed as complete units without prior dicing into shorter lengths so improving the efficiency and ease of automation of the process and also reducing the contamination attributable to the dicing or slicing process. This again improves the economics of the process as a complete plant dedicated to cutting and handling of the fuel rod pieces may be dispensed with.

BRIEF SUMMARY

In a first aspect, the present invention is characterized in that the zirconium oxide, either alone or including at least some of the fission products, is mixed with a sol or a solution of a gel forming chemical, and a green body is produced from the mixture and subsequently sintered. Examples of suitable chemicals are aluminum secondary butoxide and aluminum iso-propoxide which form complementary phases with the zirconium oxide. The gel forming chemical may be treated with a modifying agent such as an alkanolamine, an example of which is triothanolamine, to stabilize them. This is due to metal alkoxides being readily precipitated in the presence of moisture. When stabilized a polycondensation reaction occurs promoting gelation on hydrolysis. This results in a stable cross-linked inorganic polymer gel. The modified chemical is mixed with the zirconium oxide to form a slurry, the proportion of zirconium oxide being added such that the resulting mixture is still workable and the density is as high as possible to minimize shrinkage during subsequent processing. The proportion of water added to the slurry controls the gelation time. The slurry so formed is then cast into a mold or otherwise formed into desired shapes such as by extrusion for example, and allowed to set. Once set, the green bodies are removed from their mold, if appropriate, and slowly dried so as to minimize cracking during shrinkage. The dried green bodies are then sintered to densify and increase the strength of the articles for long term storage in a repository.

A hydrolyzed zirconium salt or other metal salt such as a chromium salt may be used instead of the aluminum alkoxide.

In a second aspect, the present invention is characterized in that the oxide is mixed with a material which is a chemical or a combination of chemicals which gels and hardens by heat (rather than by hydrolysis), and a green body is produced from the mixture and subsequently sintered. Examples of suitable materials include zirconium acetate, zirconium acetate/citric acid, zirconium nitrate/citric acid and zirconium acrylamide.

A particular advantage of the present invention in its second aspect is that after the drying process bonds are formed between the zirconium oxide particles and the residual material resulting from either the aluminum alkoxide or from the zirconium sol for example; this residual material comprises aluminum, zirconium and oxygen, as appropriate, on a molecular scale. Due to this residual material being on a substantially molecular scale, the necessary sintering reaction is greatly enhanced. It is expected that the temperature will be generally lower than those normally needed for sintering similar zirconia powder bodies.

In a third aspect, the present invention is characterized in that the zirconium oxide, either alone or including at least some fission product, is mixed with a gel which is freeze castable, and a green body is produced from the mixture and subsequently sintered. That is, the oxide is initially bound together by the so-called freeze-casting technique utilizing a sol-gel method. Gelation takes place by dehydration of the sol during freezing and, at a critical concentration, the sol particles form chemical bonds. The result of this is that when an oxide mass which was previously a slurry, is brought back to room temperature from its freezing temperature, it remains in the green state in a stable solid and handleable form. Due to the formation of ice crystals as a result of the freezing process, the ceramic particles take up space between the ice crystals and form a continuous matrix around the crystals. On sintering of the thawed and dried green body, very little shrinkage occurs. Furthermore, due to the strong bonding produced during sol-gel freeze-casting, sintering temperatures are relatively low thus promoting relatively little shrinkage and consequent cracking.

A particular advantage of the freeze-casting technique is that it is essentially solvent free thus, reducing the hazardous and consequent on-costs by way of more complex plant usually associated with the use of solvents. Prior technology related to the use of the freeze-casting technique is applicable to the second preferred embodiment.

In the third aspect of the present invention utilizing the freeze-casting technique, the zirconium oxide and fission products may be combined with a silica sol, or alternatively, with a zirconia sol.

In the invention, in any of the first, second and third aspects, filler powders such a zircon ($ZiSiO_4$) for example may be added to the zirconium oxide waste and sol to control shrinkage on sintering. Other ceramic filler powders may also be added as appropriate. The role of filler powder may be fulfilled by suitable content levels of the zirconium oxide waste powder itself. The use of filler powders also applies to the process of the first preferred embodiment.

The present invention also provides a process for the disposal of nuclear waste comprising converting at least said zirconium based metal into a sintered body according to any of the first second and third aspects and storing said body.

The present invention also contemplates the encapsulation of fission product oxides within the sintered zirconium oxide body.

DRAWINGS

Figure 2:
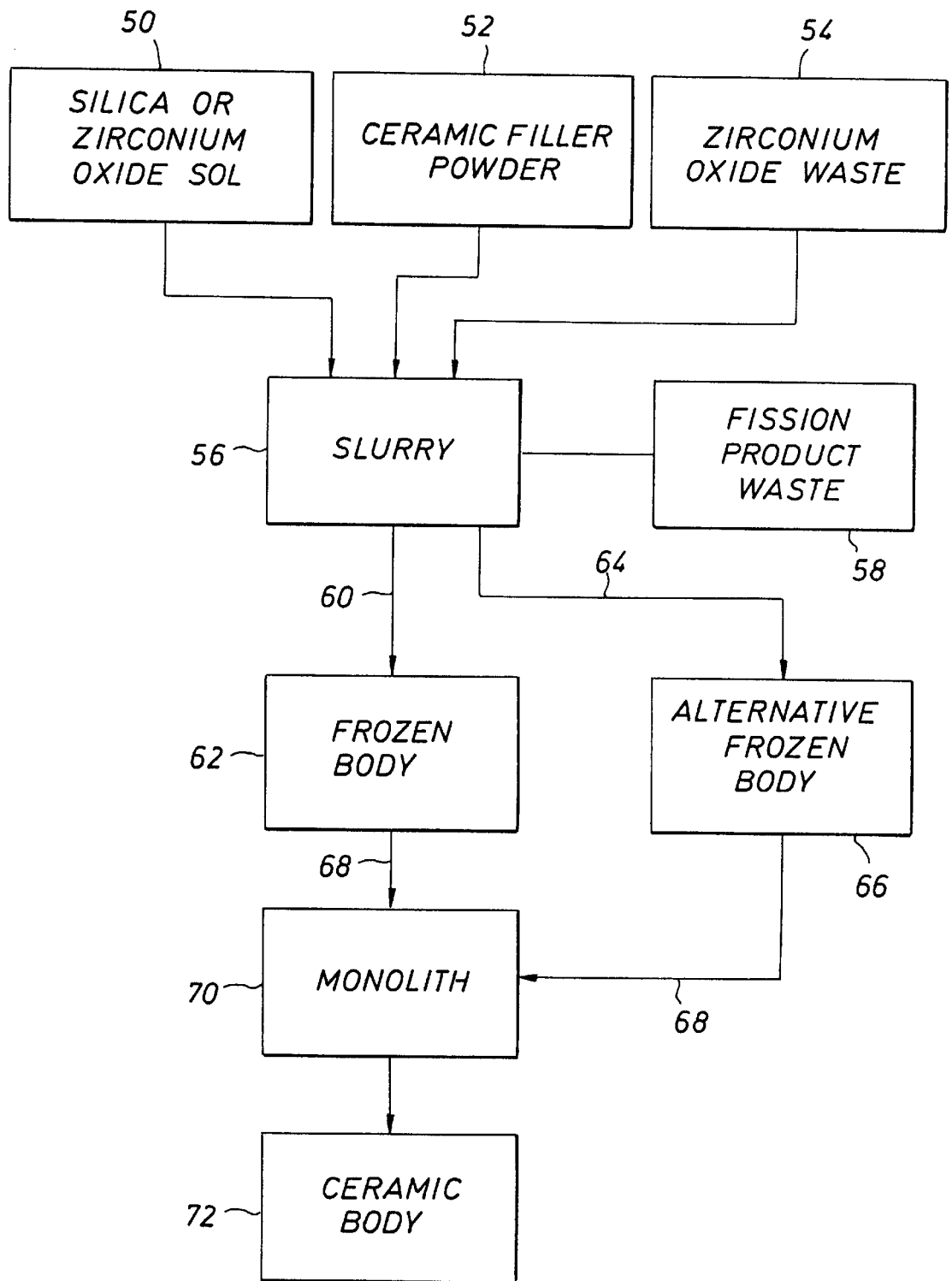

In order that the present invention may be more fully understood, examples will now be described with reference to the accompanying drawings of which:

FIG. 1 shows a flow chart of a first preferred embodiment of a process according to the present invention; and FIG. 2 which shows a flow chart of a second preferred embodiment of a process according to the present invention.

DETAILED DESCRIPTION

The process according to a first embodiment of the present invention may be described as follows and with reference to the flow chart shown in FIG. 1. A source of zirconium alloy fuel rod cladding is indicated at 10. The cladding is brought into solution by electrochemical dissolution 12 by making the cladding anodic and passing a current through the metal under a nitric acid electrolyte. This step results in the metal being converted to zirconium nitrate 14. However, during the dissolution step 12, a substantial quantity of the zirconium alloy is converted directly to an oxide which forms a sludge at the bottom of the dissolution tank and is subsequently removed to be added back into the process at a later stage. The zirconium nitrate is then thermally decomposed in the step 16 to the oxide 18 by one or more of the techniques including direct heating, fluidised bed, plasma-arc or microwave assisted heating The oxide 18 is then mixed in the step 20 with a sol of a gel forming chemical which in this case is aluminium secondary butoxide which is diluted with alcohol and modified with an alkanolamine, which is in this case, tri-ethanolamine. The modifying agent causes cross linking of the aluminum secondary butoxide in a controlled and time dependent manner on hydrolysis resulting in the onset of gelling. The zirconium oxide mixed with the gelling aluminum secondary butoxide forms a slurry 22 to which may optionally be added material 24 such as oxides of fission products and/or plutonium 26 which have been extracted from the dissolved spent uranium fuel by a known so-called "PUREX" process, the fission products and plutonium constituting high level waste which must be encapsulated and stored in a repository for many years. The slurry 22 continues to gel and is cast or extruded 28 into molds or self supporting shapes at the steps 30 where it is allowed to fully gel and solidify. After setting, the shaped "green" bodies are demolded 32, if appropriate, to form free-standing, handleable bodies 34 which are then dried slowly 36 to prevent excessive cracking during shrinkage. The dried green bodies 38 are then sintered 40 at a substantially lower temperature than that required for physically mixed oxides to form durable refractory material monoliths 42 which may then be stored 44 in a repository 46 in a known manner.

During the drying step 36, the water is driven off and the hydroxyl groups in the chemical matrix are decomposed to leave only aluminum and oxygen present in the structure on a substantially molecular scale and binding together the powder particles of zirconium oxide and also the particles of other constituents; the sintering rate during the sintering step 40 is very high and can be accomplished at relatively lower temperatures in the region of about 1400° C. compared with the higher temperatures conventionally used to sinter pressed green bodies of zirconium oxide.

Therefore, the preferred embodiment of the present invention has many advantages over known techniques in that the resulting monoliths of refractory zirconium oxide are chemically both very stable and very durable and able to encapsulate the high level waste directly within the matrix. Furthermore, the low sintering temperature which the preferred embodiment of the process of the present invention permits reduces hazards associated with high vapor pressures of some elements and consequently further reduces contamination and plant costs.

FIG. 2 shows a flow sheet of an alternative process according to the present invention utilizing the technique of freeze casting. A freeze castable silica or zirconium oxide sol 50 is mixed with a ceramic filler powder 52 and zirconium oxide waste 54 to form a slurry 56. The starting materials 52, 54 may be milled to improve homogeneity and mixing prior to forming the slurry 56. The zirconium oxide waste 54 may include fission products incorporated therein but, high-level fission product waste 58 may alternatively be added separately or additionally as a constituent of the slurry 56. The slurry 56 is cast 60 into a mold (not shown) having a cavity of any desired shape and freeze-cast to form a frozen body 62. The mold may be vibrated to assist packing of the slurry material within the mold and to assist mold filling by the elimination of air bubbles. The slurry 56 may alternatively be freeze extruded 64 to form an alternative frozen body 66. The freeze casting process causes the slurry constituents to form chemical bonds such that when the frozen body 62 or 66 is warmed at the steps 68 and the body demolded, it forms a relatively strong, free-standing and handleable monolith 70. The thawed body 70 is dried slowly to avoid too rapid shrinkage and consequent cracking and, once dried, it is sintered to form a high density, durable ceramic body 72 containing high level fission product waste material.

A first example of the second preferred embodiment of the process of the present invention is to form a zircon, $ZrSiO_4$, monolith. The process comprises making a mixture of a castable silica sol which is mixed with a zircon filler powder and waste zirconium oxide formed from the electrochemical dissolution of zirconium metal fuel cans. The mixture may also contain fission products from the zirconium metal waste stream or, fission product waste may be added as a separate component of the mixture. The process comprises the steps of vibro-energy milling the powder constituents to homogenize and thoroughly mix thus, breaking up zirconia flakes from electrochemical dissolution. The milling may take place wet so as to reduce dust and contamination hazard so the milled and homogenised powder is added to silica-sol to form the ceramic slurry 56, the slurry being capable of being poured into a mold (not shown) or at least capable of being so transferred to a mold. The mold may be connected to a vacuum system so as to remove entrained air or may be provided with a vibratory system for the same purpose and also to assist mold filling. The filled molds are rapidly cooled to about −50° C. to freeze them and aged for a suitable period which may range from about 10 minutes to longer times. Once aged, the filled molds are rapidly warmed to room temperature and the now solid monoliths are removed from the molds and dried in air. The dried monoliths are then sintered at a minimum temperature of 1400° C. The free silica from the sol reacts with a stoichiometric amount of zirconium oxide waste on sintering to form zircon. The small particle size of the sol and filler particles ensures lower sintering temperatures than normal ceramic forming processes used heretofore. Chemical bonds are formed during the freeze casting process between the silica and zirconium oxide and other constituents which are reinforced and serve to accelerate the sintering process at a low sintering temperature.

An alternative to silica-sol is the use of zirconium oxide sol. This process involves the mixing of a zircon filler powder with zirconium waste and optionally fission product waste which is then mixed with a zirconium oxide sol. The process steps for producing a sintered zircon and stabilised zirconium oxide monolith are essentially as described above with reference to the formation of a monolith using the silica-sol route.

As noted above, oxides of zirconium generally refer to the oxide plus a wide range of other materials which are not pure oxide; the other materials are mixed in the feed and therefore become part of the finished product, namely, the sintered disposable monoliths. While the foregoing is directed to the disclosed embodiment, the scope is set forth in the following claims.

What is claimed is:

1. A process for the treatment of zirconium based metal waste, the process including the steps of converting at least some of said zirconium based metal to an oxide thereafter forming a mixture of said oxide with a sol or a solution of a suitable gel forming material producing a green body from the mixture, and sintering said green body into a sintered body.

2. A process according to claim 1 wherein said material hardens by hydrolysis.

3. A process according to claim 2 wherein said gel forming material comprises a metal salt.

4. A process according to claim 3 wherein said salt is an alkoxide.

5. A process according to claim 4 wherein said alkoxide is aluminum secondary butoxide or aluminum isopoxide.

6. A process according to claim 1 wherein the gel forming material is treated with a modifying agent.

7. A process according to claim 6 wherein said modifying agent is an alkanolamine.

8. A process according to claim 7 wherein said alkanolamine is triethanolamine.

9. A process according to claim 1 wherein the zirconium oxide is mixed with a hydrolyzed zirconium salt or other metal salt.

10. A process according to claim 1 wherein the green body is dried prior to sintering.

11. A process according to claim 1 wherein the green body is formed in a desired shape by casting in a mold or by extrusion.

12. A process according to claim 1 wherein additional metal oxides are present in said green body to stabilize the chemical phases of said sintered body.

13. A process according to claim 1 wherein the sintering temperature is in the region of 1400° C.

14. A process according to claim 1 wherein said zirconium based metal is brought into solution by chemical or by electrochemical dissolution.

15. A process according to claim 14 wherein said oxide includes at least some zirconium oxide formed directly as a result of said dissolution.

16. A process according to claim 14 wherein said oxide includes at least some zirconium oxide formed by conversion from said zirconium based metal in solution.

17. A process according to claim 14 wherein the metal solution is in the form of a nitrate.

18. A process according to claim 17 wherein the nitrate is thermally treated to decompose the nitrate to the oxide.

19. A process according to claim 14 wherein the zirconium based metal is brought into solution by means of dissolution of a fluoride.

20. A process according to claim 1 wherein the zirconium based metal waste is derived from the cladding of a nuclear fuel rod.

21. A process according to claim 20 wherein the zirconium based metal is derived from whole fuel rods comprising irradiated fuel.

22. A process according to claim 21 wherein said zirconium based metal is brought into solution by chemical or by electrochemical dissolution, said oxide includes at least some zirconium oxide formed by conversion from said zirconium based metal in solution, and fuel constituents of the solution are separated prior to said conversion of the solution to the oxide.

23. A process according to claim 22 wherein at least some fission product constituents remain with the zirconium solution and the resulting oxide.

24. A process according to claim 1 wherein the sintered body is hot pressed to densify it.

25. The process for the treatment of zirconium based metal waste of claim 1 further comprising the step of storing said sintered body.

26. A process for the treatment of zirconium based metal waste, the process including the steps of converting at least some of said zirconium based metal to an oxide, thereafter forming a mixture of said oxide with a suitable material which gels and harden by heat, producing a green body from the mixture, and sintering said green body.

27. A process according to claim 26 wherein said material is selected from the group consisting of zirconium acetate, zirconium acetate combined with citric acid, zirconium nitrate combined with citric acid and zirconium acrylamide.

28. The process for the treatment of zirconium based metal waste of claim 26 further comprising the step of storing said sintered green body.

29. A process for the treatment of zirconium based metal waste, the process including the steps of converting at least some of said ziconium based metal to an oxide, thereafter forming a mixture of said oxide with a sol which gel and is freeze-castable, producing a green body from the mixture, and sintering said green body.

30. A process according to claim 29 wherein the sol comprises a silica sol or a zirconia sol, and the mixture thereof with the said oxide is solidified by freeze-casting to form a solid, handleable green body for sintering.

31. A process according to claim 29 wherein filler powder is included in said mixture.

32. A process according to claim 29 wherein said mixture is frozen at a temperature in the region of −50° C.

33. A process according to claim 29 wherein the green body is thawed prior to sintering.

34. The process for the treatment of zirconium based metal waste of claim 29 further comprising the step of storing said sintered green body.

* * * * *